United States Patent
Gaudin et al.

(10) Patent No.: US 8,416,618 B2
(45) Date of Patent: Apr. 9, 2013

(54) WRITABLE MAGNETIC MEMORY ELEMENT

(75) Inventors: Gilles Gaudin, Le Sappey (FR); Ioan Mihai Miron, Mataro (ES); Pietro Gambardella, Sant Cugat des Valles (ES); Alain Schuhl, Grenoble (FR)

(73) Assignees: Centre National de la Recherche Scientifique, Paris (FR); Commissariat a l'Energie Atomique et aux Energies Alternatives, Paris (FR); Universite Joseph Fourier, Grenoble Cedex (FR); Institut Catala de Nanotechnologia (ICN), Bellaterra (ES); Institucio Catalana de Recerca I Estudis Avancats (ICREA), Barcelona (ES)

( * ) Notice: Subject to any disclaimer, the term of this patent is extended or adjusted under 35 U.S.C. 154(b) by 386 days.

(21) Appl. No.: 12/899,091

(22) Filed: Oct. 6, 2010

(65) Prior Publication Data

US 2012/0020152 A1    Jan. 26, 2012

(30) Foreign Application Priority Data

Jul. 26, 2010   (FR) ..................................... 10 03123

(51) Int. Cl.
*G11C 11/14* (2006.01)
(52) U.S. Cl. ........ 365/171; 365/148; 365/158; 365/172; 977/933; 977/935
(58) Field of Classification Search .............. 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 6,269,018 B1 | 7/2001 | Monsma et al. | |
| 6,538,921 B2 * | 3/2003 | Daughton et al. | 365/171 |
| 2006/0023489 A1 * | 2/2006 | Ditewig et al. | 365/158 |
| 2007/0109853 A1 | 5/2007 | Ho | |
| 2009/0003042 A1 * | 1/2009 | Lee et al. | 365/158 |
| 2009/0237987 A1 * | 9/2009 | Zhu et al. | 365/171 |

OTHER PUBLICATIONS

Preliminary Search Report for Application No. FR 10 03123 dated Jan. 25, 2011.

* cited by examiner

*Primary Examiner* — Harry W Byrne
(74) *Attorney, Agent, or Firm* — Alston & Bird LLP

(57) ABSTRACT

The invention relates to a writable magnetic element comprising a stack of layers presenting a write magnetic layer, wherein the stack has a central layer of at least one magnetic material presenting a direction of magnetization that is parallel or perpendicular to the plane of the central layer, said central layer being sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, wherein it includes a device for causing current to flow through the second outer layer and the central layer in a current flow direction parallel to the plane of the central layer, and a device for applying a magnetic field having a component along a magnetic field direction that is either parallel or perpendicular to the plane of the central layer and the current flow direction, and wherein the magnetization direction and the magnetic field direction are mutually perpendicular.

24 Claims, 3 Drawing Sheets

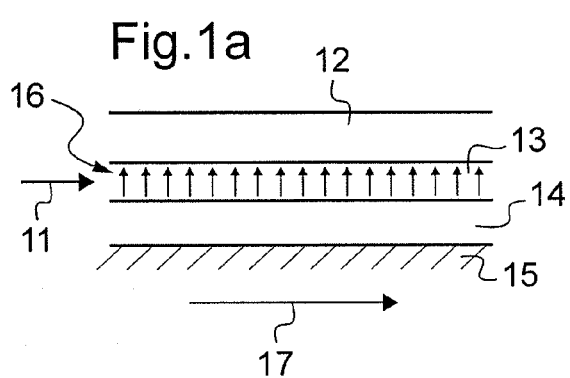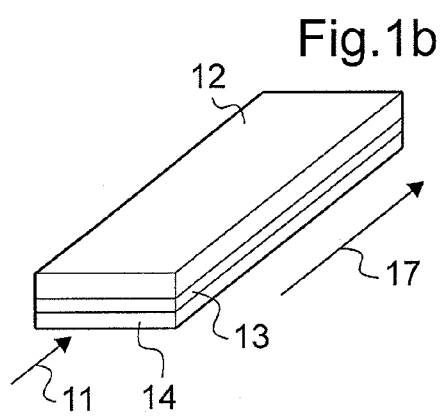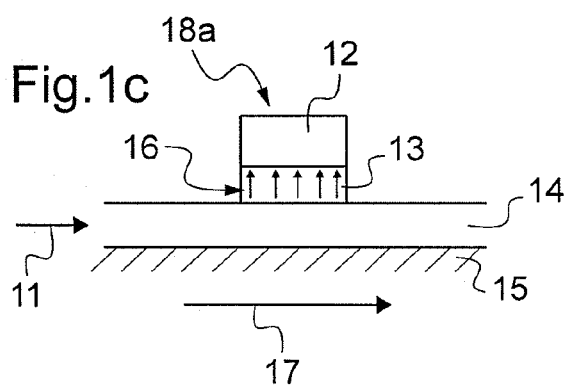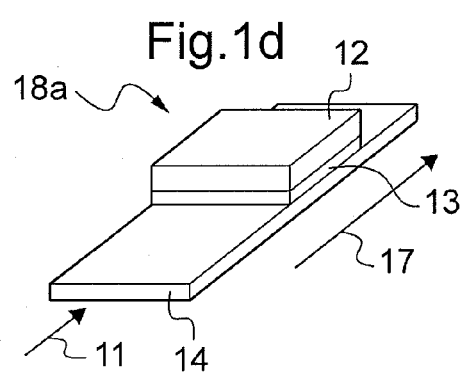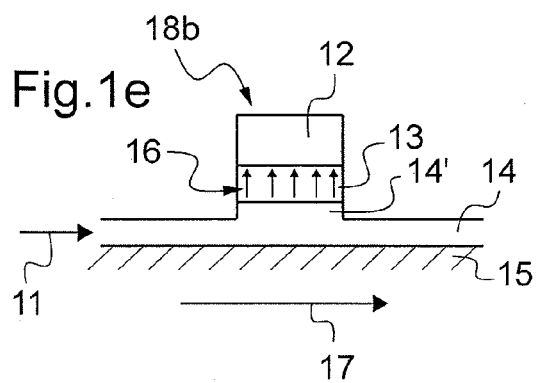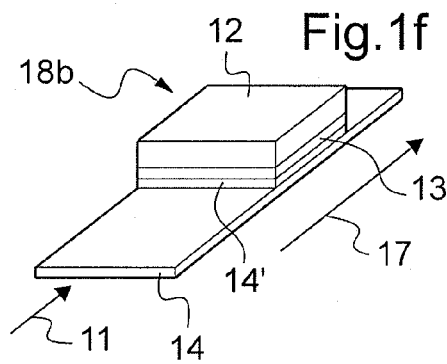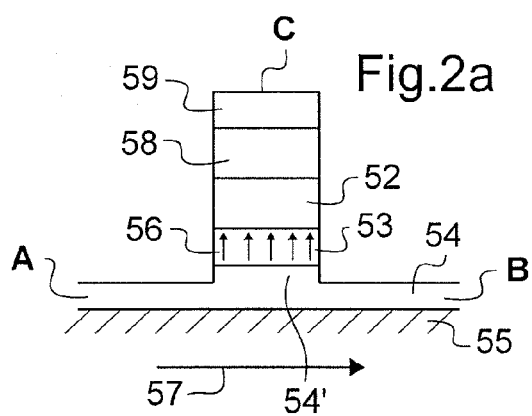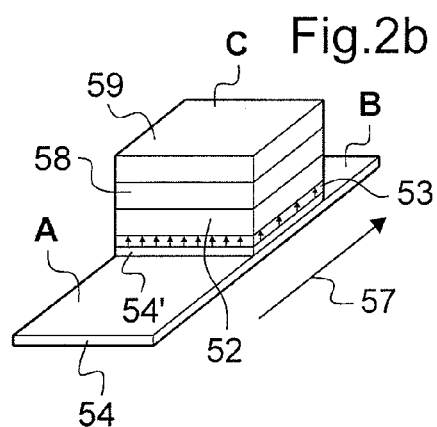

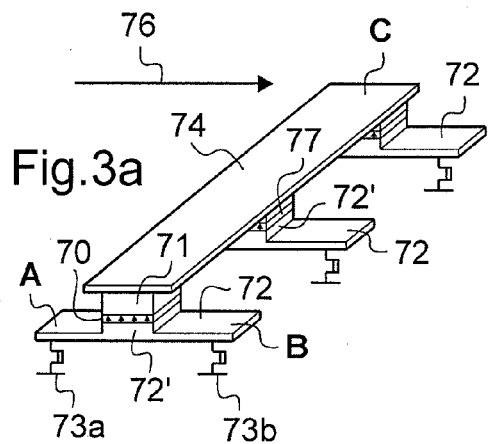
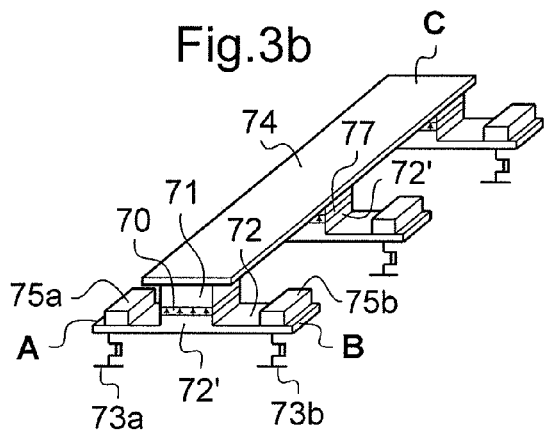
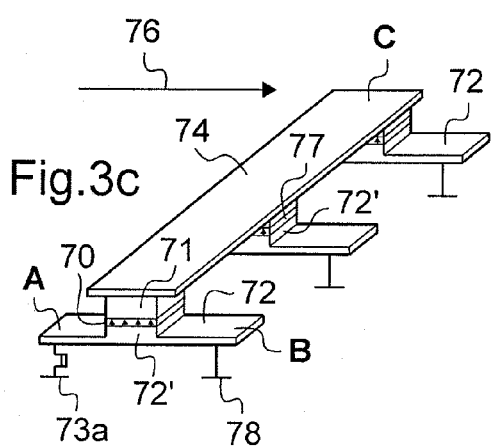
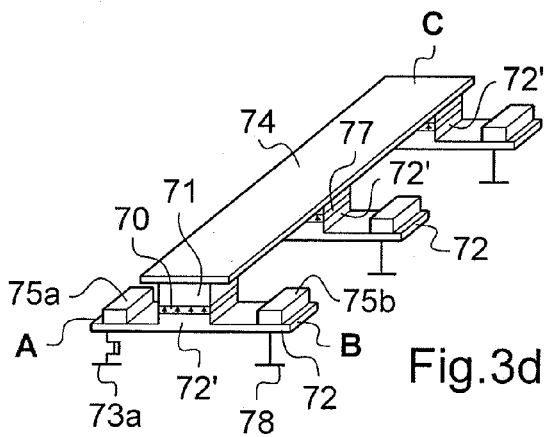
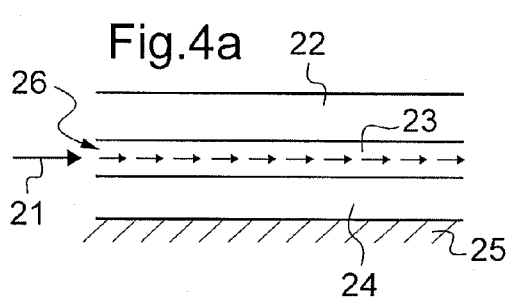
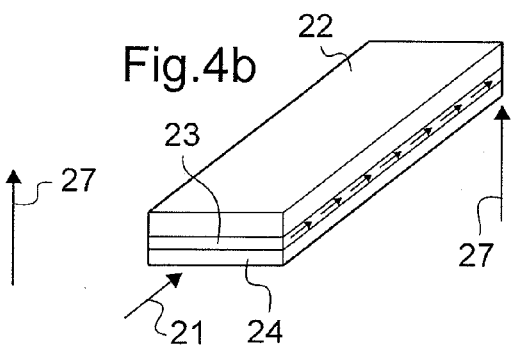
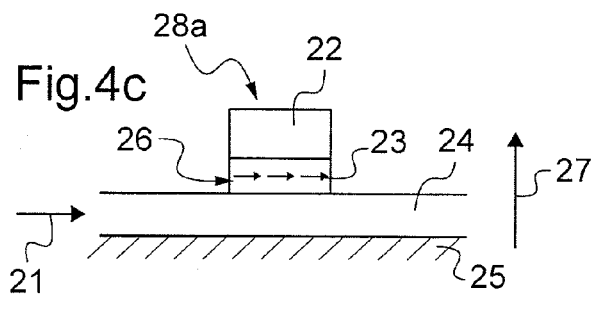
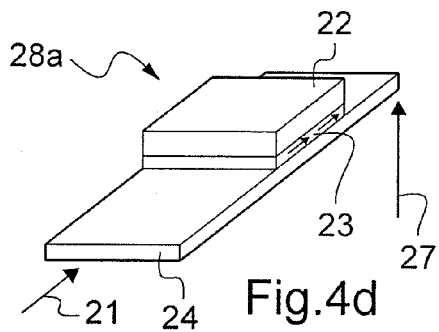

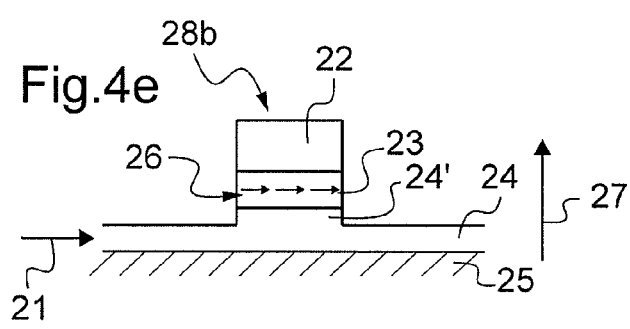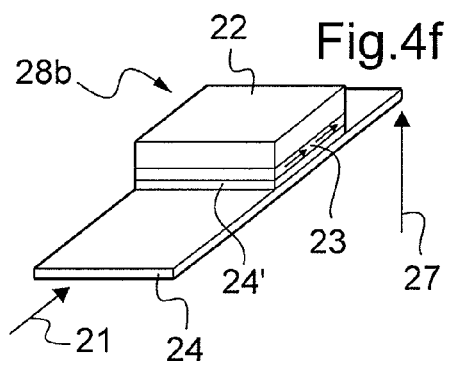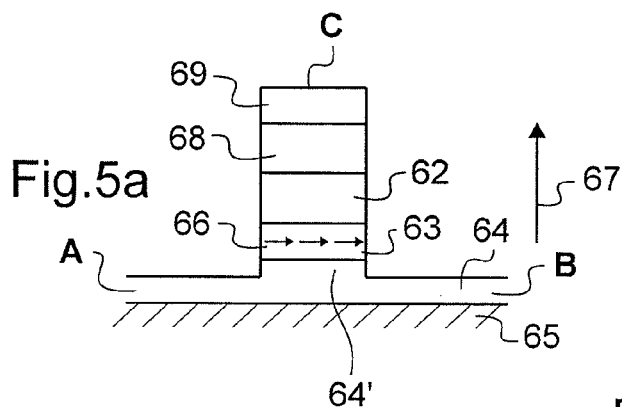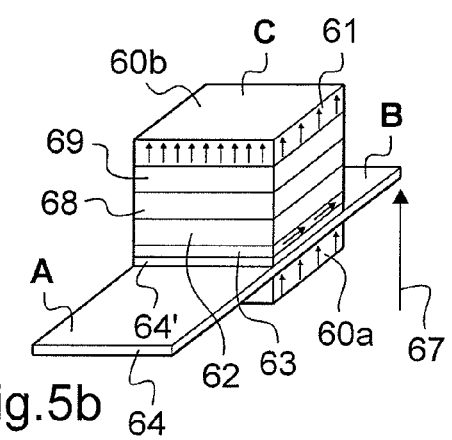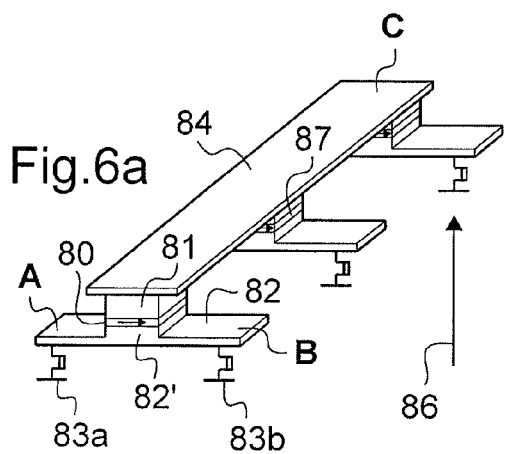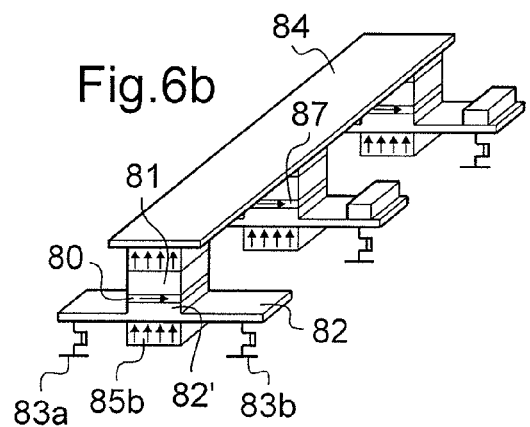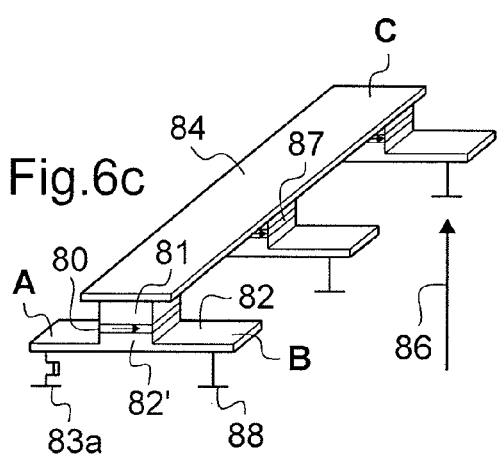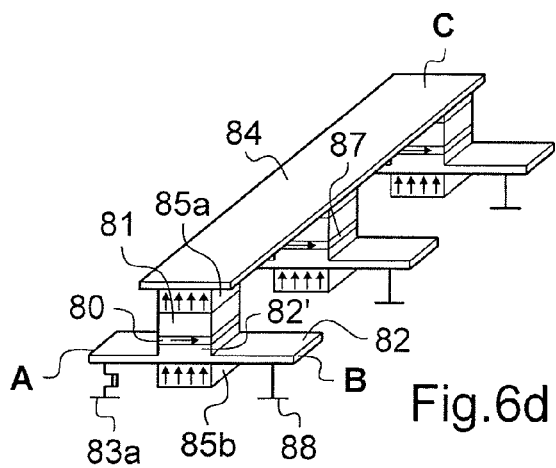

WRITABLE MAGNETIC MEMORY ELEMENT

FIELD OF THE INVENTION

The present invention provides a writable magnetic element of the current-induced reversal type.

BACKGROUND OF THE INVENTION

The magnetization of a layer or of a small magnetic element is commonly reversed by means of an applied magnetic field. The direction of the field is changed depending on whether it is desired to turn the magnetization in one direction or in another. Writing on magnetic tracks or on computer hard disks is based on this principle: the element for reversing is placed mechanically in the vicinity of a magnetic field generator so as to localize the field in three dimensions. It is the very structure of a magnetic field, which by definition is not localized in three dimensions, that raises numerous difficulties for integrating magnetic fields in devices. Thus, when no mechanical action is possible or desired, e.g. with solid magnetic memories known as magnetic random access memories (MRAM) or with logic devices, it is necessary to focus the magnetic field sufficiently for it to act only on the target cell and without impacting its neighbors. This problem becomes increasingly severe when the various memory or logic cells are located very close to one another in order to increase the density thereof.

The possibility of manipulating magnetization by means of a spin-polarized current, which was initially demonstrated theoretically in 1996, has provided a first solution to this problem. For the purpose of manipulating the magnetization at a memory point, this physical principle referred to as spin transfer torque (STT) requires the presence of at least two magnetic layers separated by a non-magnetic metal (for a spin valve type structure) or by an insulator (for a magnetic tunnel junction type structure), the two layers having magnetizations that are not colinear. The detailed physical explanation differs depending on whether a spin valve structure or a magnetic tunnel junction structure is involved, but in outline the current becomes spin polarized on passing through the first magnetic layer and then exerts torque on the magnetization of the second layer by means of the non-colinear component of the current polarization. When current densities are high enough, the magnetization of the second magnetic layer may be reversed both in spin valves and in magnetic tunnel junctions.

As described for example in U.S. Pat. No. 7,009,877 published on Mar. 7, 2006 and in US patent application No. 2009/129143 published on May 21, 2009, the write electric current necessarily passes through the junction perpendicularly to the plane of the layers.

This ability to manipulate locally the magnetization of a magnetic element of sub-micrometer size by means of an electric current immediately opens up possibilities for applications. At present, industrial actors are seeking to incorporate this principle in novel architectures for MRAM memory cells and logic components.

At present, such incorporation encounters various difficulties that appear to be inter-related.

Reversal by STT requires the presence at the memory point of at least two magnetic layers that are separated by a non-magnetic spacer. As mentioned above, writing is performed by injecting a high-density current through the entire stack perpendicularly to the plane of the magnetic layers, while reading is performed by means of the magnetoresistance of the stack: giant magnetoresistance (GMR) for spin valves, and tunnel magnetoresistance (TMR) for magnetic tunnel junctions. At present, all or nearly all applications are based on using magnetic tunnel junctions. Thus although the GMR signal is only a few percent, the TMR signal from MgO-based junctions is commonly greater than 100%. Nevertheless, tunnel junctions have the disadvantage of presenting large values for the product of resistance multiplied by area (RA). Thus, for a typical current density of $10^7$ amps per square centimeter (A/cm$^2$) as needed for STT reversal, the voltage at the edges of the junction is 10 volts (V) for an RA of 100 ohm-square micrometers ($\Omega\cdot\mu m^2$), 1 V for an RA of 10 $\Omega\cdot\mu m^2$, and 0.1 V for an RA of $\Omega\cdot\mu m^2$. Apart from the smallest value, the power dissipated in the junction is then large, which is harmful both in terms of energy consumption and in terms of damaging said junction.

Furthermore, the high values of TMR that are useful in reading are often obtained by stacks that present high values for RA.

That is why present research is seeking to obtain tunnel junctions that present high values of TMR and small values of RA. In addition, even for relatively small values of voltage at the edges of the junction, accelerated aging phenomena of the junction have been observed in operation that are due to voltage cycling. At present, numerous studies are devoted to this point both for optimizing materials in existing configurations and also for defining new configurations in order to decouple the write and read phenomena as much as possible.

To summarize, a difficulty lies in the impossibility of independently optimizing reading and writing since, in known STT devices, those two phenomena are intrinsically linked.

Another difficulty lies in the fact that writing requires current to be passed through the stack at very high density.

Yet another difficulty that is inherent to this link comes from the ever-greater complexity of the stacks. Thus, if it is desired that the STT effect is felt only in the layer that is to be reversed in order to store the magnetization, it is necessary for example to stabilize the other layers by means of exchange coupling with an antiferromagnetic material: if it is desired to increase the amplitude of the STT transfer, it is necessary to optimize the polarizing layers; if it is desired to reduce the magnetic fields radiated on the sensitive layers, it is necessary for example to use artificial antiferromagnetic bilayers; etc.

As a result, typical magnetic stacks of MRAM cells or logic components may have more than ten or 15 different layers of various materials. This then gives rise to difficulties during structuring steps, and in particular during the etching step, which is one of the major blocking points for integrating such magnetic stacks.

Another line of research is to manipulate the magnetization by means of an outer electric field. This may be accomplished in part by modifying the anisotropy of a material by means of an outer electric field, with magnetization being reversed by means of an applied magnetic field. One such technique is described in the article by T. Maruyama et al. entitled "Large voltage-induced magnetic anisotropy charge in a few atomic layers of iron" (Nature Nanotechnology, Vol. 4, March 2009—Macmillan Publishers Ltd.).

At present, that technique makes it possible only to reduce the magnetic anisotropy of the material. The write and read processes are then the same as those described above, and they have the same drawbacks.

SUMMARY OF THE INVENTION

An object of the present invention is to provide a magnetic memory that, in order to invert magnetization, requires only the presence of a magnetic layer (having magnetization that is parallel or perpendicular to its plane) and that operates without the stack needing to pass a current perpendicularly to the planes of the layers.

The invention thus provides a writable magnetic element comprising a stack of layers presenting a write magnetic layer, wherein the stack has a central layer of at least one magnetic material presenting a direction of magnetization that is parallel or perpendicular to the plane of the central layer, said central layer being sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, wherein it includes a device for causing current to flow through the second outer layer and the central layer in a current flow direction parallel to the plane of the central layer, and a device for applying a magnetic field having a component along a magnetic field direction that is either parallel or perpendicular to the plane of the central layer and the current flow direction, and wherein the magnetization direction and the magnetic field direction are mutually perpendicular.

Advantageously, the magnetic field is either parallel or perpendicular to the plane of the central layer and the current flow direction, or in other words the direction of the applied magnetic field coincides with said magnetic field direction.

Two configurations are possible:

In a first configuration, the magnetic field direction is parallel to the current flow direction, and the magnetization is perpendicular to the plane of the magnetic central layer.

In a second configuration, the magnetization direction is parallel to the current flow direction and the magnetic field direction is perpendicular to the plane of the magnetic central layer.

In both configurations, the electric current flows parallel to the magnetic layer and does not pass through the stack in a direction perpendicular to the planes of the layers, rather it passes through the central magnetic layer and at least the second outer layer in at least one current flow direction parallel to the planes of the layers, and the memory may be written by acting either on the direction of the current or on the direction of the magnetic field.

The central layer advantageously has thickness lying in the range 0.1 nanometers (nm) to 5 nm. In the first configuration, this value is preferably less than or equal to 2 nm. In the second configuration, this value is preferably less than or equal to 3 nm.

When the magnetization direction is perpendicular to the plane of the layer, the central layer may comprise an alloy presenting its own perpendicular magnetic anisotropy, i.e. in particular FePt, FePd, CoPt, or indeed a rare earth and transition metal alloy that likewise presents its own perpendicular magnetic anisotropy, such as GdCo, TdFeCo. The central layer may also comprise a metal or an alloy presenting in the stack perpendicular magnetic anisotropy induced by the interfaces, in particular Co, Fe, CoFe, Ni, CoNi.

When the magnetization direction is contained in the plane of the layers, the central layer may comprise a metal or an alloy presenting planar magnetic anisotropy in the stack, in particular Co, Fe, CoFe, Ni, NiFe, CoNi.

At least one conductive outer layer is made of a non-magnetic metal, preferably Pt, W, Ir, Ru, Pd, Cu, Au, Bi, or of a non-magnetic alloy of these metals. The thickness of such a conductive layer may lie in the range 1 nm to 10 nm and is preferably less than or equal to 5 nm. The value of this thickness has no relationship with the value selected for the thickness of the central layer.

One of the non-conductive outer layers is made of an electrically insulating material, preferably a dielectric oxide such as $SiO_X$, $AlO_X$, $MgO_X$, $TiO_X$, $TaO_X$, $HfO_X$, or of a dielectric nitride such as $SiN_X$, $BN_X$. The thickness of this outer layer may for example lie in the range 0.5 nm to 200 nm, and more particularly in the range 0.5 nm to 100 nm, and is preferably less than or equal to 3 nm, in particular if the memory element is read by means of the tunnel magnetoresistance signal.

Both outer layers may be conductive, but they are then selected from two different ones of said non-magnetic metals or metal alloys.

The current density lies for example in the range $10^4$ A/cm$^2$ to $10^9$ A/cm$^2$, and advantageously in the range $10^5$ A/cm$^2$ to $10^8$ A/cm$^2$.

The applied magnetic field may present a value lying in the range 0.002 teslas (T) to 1 T, and advantageously lying in the range 0.005 T to 0.8 T.

The first outer layer (the layer through which said current does not pass) may be covered in a read layer of a magnetic material and a read electrode. When the first outer layer is made of non-magnetic metal, it co-operates with the read layer, the read electrode, and the central layer to form a spin valve. When the first outer layer is dielectric, it co-operates with said read layer, the read electrode, and the central layer to form a magnetic tunnel junction. The thickness of the first outer layer is then preferably less than 3 nm.

The magnetic element may be structured in such a manner that the first outer layer and the central layer form a stud, while the second outer layer forms a track. The second outer layer may include a region of extra thickness that forms part of the stud.

The invention also provides a writable magnetic device including a plurality of said studs, in which the second outer layer is constituted by a said track that is common to the studs.

Alternatively, the first outer layer, the central layer, and the second outer layer form a stud, and the writable magnetic device has a plurality of said studs together with a conductive track bordering the second outer layers of said studs to inject said current through the second outer layer and the central layer of each of said studs, each second outer layer being made of an electrically conductive material that is different from that of the conductive track.

BRIEF DESCRIPTION OF THE DRAWINGS

The invention can be better understood on reading the following description with reference to the drawings, in which:

FIGS. 1a to 1f show a first configuration for implementing the invention;

FIGS. 2a and 2b showing an embodiment integrated in an MRAM type magnetic memory cell;

FIGS. 3a to 3d showing embodiments in which a plurality of memory elements are shown to illustrate the architecture of the memory;

FIGS. 4a to 4f show a second configuration for implementing the invention;

FIGS. 5a and 5b showing an embodiment integrated in an MRAM type magnetic memory cell; and FIGS. 6a to 6d showing embodiments in which a plurality of memory elements are shown to illustrate the architecture of the memory.

DETAILED DESCRIPTION

The stack implemented in the context of the present invention, i.e. a central magnetic layer sandwiched between two outer layers that are not magnetic, and at least one of which is conductive, the two outer layers being of different materials, has the effect of creating inversion asymmetry that generates a non-compensated electric field in the magnetic central layer. The electrons propagating in this electric field are subjected in their own frame of reference to a magnetic field known as the Rashba field $\vec{H}_R$ of direction that is perpendicular both to the current and to the electric field. This magnetic field is thus applied to the conduction electrons.

The inventors have shown that an effective magnetic field resulting from the Rashba field and the exchange interaction coupling the spin of the itinerant and localized electrons is applied on the local magnetization. Thus, the article by Joan Mihai Miron et al. entitled "Current-driven spin torque induced by the Rashba effect in a ferromagnetic metal layer", shows that a stack having a 3 nm thick layer of Pt, a 0.6 nm thick layer of Co having magnetization perpendicular to its plane and thus parallel to the z axis, and a 2 nm thick layer of $AlO_X$ conveying a current flowing parallel to the x axis. That situation presents an effective magnetic field $H_{eff}$ along the third axis of the reference frame, the y axis. That configuration is thus inappropriate for making a memory since the magnetic field is not colinear with the magnetization of the layer.

Surprisingly, the inventors have shown that that theoretical obstacle can be overcome by using what they interpret as being the result of magnetization dynamics due to the interaction of the field $H_{eff}$ and an outer magnetic field having a component perpendicular to $H_{eff}$ when a current is injected into a structure that presents inversion asymmetry, the direction of the component perpendicular to $H_{eff}$ of the magnetic field being either colinear with the current injection direction (first configuration), or else perpendicular to said direction (second configuration).

FIGS. 1a to 1f show the first configuration for implementing the invention in which the direction of the applied magnetic field is parallel to the direction of the current and the direction of magnetization is perpendicular to the plane of the magnetic central layer. The applied magnetic field is thus perpendicular both to the magnetization and to the direction of the effective magnetic field $H_{eff}$.

Reference 15 designates a substrate that is an electrical insulator so as to avoid short-circuiting the structure. It may in particular be constituted by a dielectric oxide (e.g. $SiO_X$, $AlO_X$, $MgO)_X$ or by a nitride, e.g. $SiN_X$. It may be on its own or it may be deposited on some other substrate, e.g. of silicon.

Reference 13 designates the plane magnetic layer of magnetization that is perpendicular to its plane. Reference 16 designates the orientation of the magnetization, which may be present in one direction or in the opposite direction.

References 12 and 14 designate respectively the first and second non-magnetic outer layers. The second outer layer 14 is the layer through which current passes during writing.

Reference 11 designates the write current direction which may be oriented in this direction or in the opposite direction, and reference 17 designates the orientation of the applied magnetic field, which is colinear with the current direction and which may be oriented in the same direction or in the opposite direction.

FIGS. 1a and 1b show a non-structured stack in which the layers 12, 13, and 14 of the stack form a track.

FIGS. 1c to 1f show a structured stack in which the layer 14 (referred to as the second outer layer) is conductive and the magnetic layer 13 and the non-magnetic layer 12 (referred to as the first outer layer) are the only layers to be structured so as to form studs (FIGS. 1c and 1d), and in which the three layers 12, 13, and 14 are structured to constitute a stud by integrating in the stud an extra thickness 14' of the conductive layer 14 such that the stud contains a fraction of the thickness of the non-magnetic material of the layer 14 (FIGS. 1e and 1f). The thickness to be taken into account for the second outer layer is the thickness of the layer 14 proper plus the extra thickness 14'.

It should be observed that the region of extra thickness 14' is not necessarily made of the same electrically conductive material as the layer 14, in which case it is only the extra thickness 14' that acts as the second non-magnetic outer layer and it is its material that is functional in the stack in order to obtain inversion asymmetry. The metallic material of the layer 14 may then be any material.

Forming studs makes it possible to reverse magnetization in the studs only, since otherwise magnetization would be reversed over the entire length of the track.

The magnetic layer 13 presents perpendicular magnetization and its thickness is rather fine so that the electric field due to the interfaces is not negligible. Typically its thickness does not exceed 2 nm and it is at most 5 nm. All of the magnetic materials presenting perpendicular magnetization, e.g. due to their own perpendicular magnetic anisotropy (FePt, FePd, CoPt, . . . alloys; alloys of rare earths and transition metals such as GdCo, TbFeCo, . . . ) or presenting a perpendicular magnetic anisotropy effect that is induced by the interfaces (Co, Fe, CoFe, Ni, CoNi, . . . ) may be used. It is also possible to take non-metallic magnetic materials such as magnetic semiconductors, for example, e.g. GaMnAs (i.e. Mn-doped GaAs). It should be observed that known magnetic semiconductor materials are magnetic only at temperatures lower than ambient.

When the perpendicular anisotropy of the magnetic material is induced by the interfaces, it is possible to obtain magnetization perpendicular to the plane by acting on the thickness of the central layer and/or on the oxidation state of an outer oxide layer, e.g. by modifying the deposition parameters of said oxide outer layer or by performing annealing after making the stack.

EXAMPLE

A stack comprising a 3 nm thick Pt conductive layer 14, a 1 nm thick Co central layer 13, and an $AlO_X$ layer 12 presents for a given oxidation state of said $AlO_X$ layer magnetization that is perpendicular, whereas if the thickness of the Co layer is equal to 1.5 nm, the magnetization is in the plane. If the stack is subjected to annealing at 300° C. for 60 minutes in a vacuum, then the magnetization of the Co central layer 13 is perpendicular to the plane.

At a thickness greater than 3 nm for the Co layer, it is not possible to obtain magnetization outside the plane regardless of the annealing or the oxidation parameters if the layer 12 is made of $AlO_X$. However, if the dielectric used for the layer 12 is $MgO_X$ it is possible to obtain perpendicular magnetization for a thickness of the central layer that is greater than or equal to 3 nm.

The influence of the thickness of a cobalt layer on magnetic properties for different oxides ($AlO_X$, $MgO_X$, $SiO_X$) is described in the article "Domain patterns and magnetization reversal behaviors in oxide/Co/Pt films" by Jae Chul Lee et al., published in IEEE Transactions on Magnetics, Vol. 46, No. 6, June 2010.

The effect of oxidation and annealing on magnetic properties in Pt/Co/$AlO_X$ trilayers is described in the article "Influence of thermal annealing on the perpendicular magnetic anisotropy of Pt/Co/AlO$_X$ trilayers" by B. Rodmacq et al., published in Physical Review B 79 024423 (2009).

The influence of the oxidation state of an oxide layer on the magnetic properties of the cobalt layer in a platinum/cobalt/metal oxide trilayer stack is described in the article "Analysis of oxygen induced anisotropy crossover in Pt/Co/MO$_X$ trilayers" by A. Manchon et al., published in Journal of Applied Physics 104, 043914 (2008).

The two non-magnetic layers 12 and 14 need to be different in order to create inversion asymmetry in the overall structure. Advantageously, two different materials are selected for each of these layers, e.g. a dielectric for one of the two and a metal for the other, however it is also possible to select a metal for each of them. Having both layers 12 and 14 dielectric is possible only if the structure forms a track and not a stud. It is then possible to cause current to flow directly in the central layer 13.

Thus, each of the two layers 12 and 14 may be constituted by the following materials, on condition that the layers are different so that the overall stack (layers 12, 13, and 14) has perpendicular magnetization: a dielectric oxide (SiO$_X$, AlO$_X$, MgO$_X$ TiO$_X$, TaO$_X$, HfO$_X$, . . . ); a dielectric nitride (SiN$_X$, Bn$_X$, . . . ); a non-magnetic metal (Pt, Pd, Cu, Au, Bi, . . . ); a non-magnetic alloy of these metals; and an optionally organic semiconductor compound (e.g. GaAs, Si, Ge or graphene associated, where necessary, with a growth buffer, e.g. a metal such as iridium).

When one or the other of the non-magnetic layers is conductive, i.e. made of a metal or an alloy, the two outer layers must not have the same composition.

The thicknesses of the layers 12 and 14 may be selected over a wide range of values, typically thicknesses of 0.5 nm to 200 nm, and more particularly lying in the range 0.5 nm to 100 nm. When the layer 12 is an insulating layer, there is no harm in its value reaching the mentioned upper limit, i.e. 200 nm, except when the memory point is read by means of a tunnel magnetoresistance signal, e.g. by adding a magnetic layer and an electrode above said insulating layer, as shown in FIGS. 2a and 2b. Under such circumstances, the thickness of the insulating layer is preferably selected to be less than 3 nm. However, with the layers 12 and/or 14 made of metal, it is preferred to have layers that are fine, typically less than 5 nm thick and generally less than 10 nm thick, so as to avoid excessively reducing the effective current passing through the magnetic layer as a result of these conductive channels in parallel. When the layer 12 is metallic and the memory point is read by means of a giant magnetoresistance signal, e.g. by adding a magnetic layer and an electrode above said metallic layer, as shown in FIGS. 2a and 2b, then the thickness of said conductive layer 12 should typically be selected to be less than 10 nm, and preferably less than 5 nm.

These various layers may be deposited by any known technique such as: evaporation, sputtering, electrochemical deposition, chemical growth, . . . .

The layer 14 may be omitted in certain shapes. The magnetic layer 13 should then be deposited directly on the insulating substrate 15 and the non-magnetic layer 12 should be selected so as to have inversion asymmetry, i.e. out of a material that is different from the material constituting the substrate 15. Nevertheless, it should be observed that when studs are structured, the layer 14 must be present and constituted by an electrically conductive material so as to be able to inject current into the central layers 13 of the structured studs (here 18a and 18b). Under such circumstances, the extra thickness portion 14' must also be conductive so that, in combination with the layer 12, the looked-for inversion asymmetry is generated in order to generate a Rashba field and enable current to be injected into the magnetic central layer 13.

The element to be reversed, whether the track shown in FIGS. 1a and 1b or a stud fitted on or structured in the track (FIG. 1c to 1f), is connected in known manner to conductive electrodes so as to inject a current into the conductive layer 14 along the axis 11 shown in FIG. 1, thereby enabling current to be injected into the magnetic central layer 13. A magnetic field is applied to the structure colinearly (17) with the current injection axis 11. The current may be applied along the axis 11 in the direction of the arrow I$_+$ or in the direction opposite to that of the arrow I$_-$. Similarly, the magnetic field may be applied along the axis 17 in the direction of the arrow H$_+$ or in the direction opposite to that of the arrow H$_-$.

A current and field direction pair stabilizes a magnetization direction.

For example, the pair I$_+$, H$_+$ stabilizes the upward magnetization configuration as shown in FIGS. 1a to 1f.

Starting from the configuration in which the magnetization of the element is magnetized uniformly upwards, it is possible to reverse it while retaining the electric current direction I$_+$ and changing the direction of the applied magnetic field H$_-$.

Another solution would be to keep the magnetic direction H$_+$ and change the electric current direction I$_-$. This solution is preferred since it makes it possible to use a static magnetic field, e.g. generated by permanent magnets so as to avoid consuming any energy.

It is possible to reverse the magnetization downwards by acting on the direction of the applied field, thereby leading to the pair (I$_+$, H$_-$), or by acting on the direction of the applied current, giving rise to the pair (I$_-$, H$_+$), with the pair (I$_-$, H$_+$) being preferred as mentioned above. Once the magnetization has been reversed, it is stable even in the absence of injected current and in the presence or absence of the static magnetic field.

Changing both the current direction and the magnetization direction leads to the pair (I$_-$, H$_-$) which also stabilizes magnetization upwards.

In general, it should be observed that it is not necessary for the outer field to be exactly parallel to the current axis. It suffices to have an outer magnetic field in a plane that is perpendicular to the magnetization, said outer magnetic field having a non-zero component parallel to the current. Reversal is observed up to an angle of 60° between the applied field and the current.

Typical values for densities of current injected into the layer 14 lie in the range $10^4$ A/cm$^2$ to $10^9$ A/cm$^2$, and they advantageously lie in the range $10^5$ A/cm$^2$ to $10^8$ A/cm$^2$.

Typical values for the magnetic field component applied along the current axis lie in the range 20 oersteds (Oe) to 10 kilo-oersteds (kOe), i.e. in the range 0.0002 T to 1 T. Advantageously, a value is selected lying in the range 50 Oe (0.005 T) to 8000 Oe (0.8 T). This must be maintained at a value that is low enough to avoid inducing an excessive decrease in the energy barrier separating the two magnetization orientations, since that would give rise to undesired reversals.

For this purpose, the value of the applied magnetic field is selected to be much less than the effective anisotropy field of the magnetic layer.

For example, a central layer of Co between a layer 14 of Pt and a layer 12 of MgO has an effective anisotropy field of 0.8 T (8000 Oe) and it is possible to apply a magnetic field of 0.008 T (800 Oe) without problems.

The value of the applied magnetic field may in practice be selected to lie in the range one-third to one-tenth of the value of the effective anisotropy field, and more particularly in the range one-fourth to one-tenth said value.

The magnetic field may be applied in various ways, e.g. in simple manner using a current flowing in one or more coils so as to generate an overall field over the device as a whole; or by means of tracks conveying current of the kind used in MRAM memories with reversal induced by a magnetic field; or, and in preferred manner, by permanent magnets placed in the vicinity of at least one stud to be reversed. This solution has the major advantage of not giving rise to any energy consumption in order to generate the magnetic field. Such permanent magnets may be obtained by structuring a magnetic deposit, thereby making it easier to integrate this reversal technique in functional devices, e.g. of the memory or logic type.

It is also possible to implement one or more permanent magnets located outside the set of studs in order to generate a field over the entire structure.

FIGS. 2a and 2b show an example of a stack usable in an MRAM writable memory cell.

Reference 53 designates the magnetic central layer sandwiched between two different non-magnetic materials 52 and 54 for making a stack as described above on an electrically insulating substrate 55.

Reference 57 designates the direction of the applied outer magnetic field.

For reading purposes there are placed above the stack a layer 58 of a magnetic material and a top electrode 59 that may contain one or more conductive layers (that may be magnetic or non-magnetic).

The function of the layer 58 is to enable the structure 53, 52, and 58 to present different electrical resistance values depending on the direction of the magnetization 56 of the layer 53 (magnetoresistance signal). It is involved only for reading and has no effect on manipulating the magnetization of the layer 53.

In other words, writing and reading are defined independently and may be optimized separately.

The electrode 59 may comprise one layer or it may in conventional manner comprise a stack of different functional layers. For example it may contain:

- a stack defining synthetic antiferromagnetism so as to limit the fields radiated onto the layer 53 that is to be manipulated, e.g. a stack comprising a ferromagnetic layer separated from the ferromagnetic layer 58 by a very fine layer of a non-magnetic metallic material, typically 0.3 nm of ruthenium (Ru), the values of the magnetizations of the two ferromagnetic layers being as close to each other as possible so that the antiferromagnetic coupling between them that is due to the presence of the ruthenium layer results in the total field as radiated by these three layers on the layer 53 being zero or practically zero;
- or else an antiferromagnetic magnetic material coupled by exchange with the layer 58 so as to stabilize this so-called "reference" layer 58;
- or else non-magnetic conductive materials for making electrical contacts;
- or indeed a combination of those various possibilities, e.g. an antiferromagnetic material adjacent to a ferromagnetic material so as to stabilize the magnetization thereof by coupling between these two materials, the ferromagnetic material being separated from the layer 58 by a fine metallic layer, typically 0.3 nm of Ru, so that the magnetic coupling between these two ferromagnetic layers is antiferromagnetic. Finally, the first magnetic material is covered in one or more non-magnetic conductive layers, e.g. 5 nm of Ta covered in 7 nm of Ru. Examples of such combinations can be found for example in the magnetic stacks used for STT reversal as described by B. Dieny et al., Int. J. Nanotechnology, Vol. 7, 591 (2010).

Two main configurations may be distinguished depending on the nature of the layer 52: if it is of non-magnetic metal, then the structure 53, 52, and 58 is of the spin valve type, whereas if the layer 52 is dielectric, then the structure 53, 52, and 58 is of the magnetic tunnel junction type. Since the magnetoresistance signal is much stronger for these structures, these are the preferred structures. Similarly, in order to further optimize the magnetoresistance signal, in both configurations it is preferred for the magnetization of the layer 58 to be colinear, i.e. parallel or anti-parallel to that of the layer 53.

In FIGS. 2a and 2b, A, B, and C designate three electrical connection terminals. During the write stage, a current is injected between the terminals A and B (or in equivalent manner, a voltage is applied between these terminals so as to cause a current to flow). The current passes through the magnetic layer 53 and in said layer it produces an effective magnetic field due to the Rashba field and to the s-d exchange interaction acting on the local magnetization (see the above-mentioned article by Miron et al.). This effective field $H_{eff}$ is referred to below in equivalent manner as the spin-orbit field or as the effective field $H_{eff}$. This spin-orbit field in combination with the applied outer field makes it possible, according to the invention, to manipulate the magnetization. When the layer 52 is constituted by a dielectric material, the laterally-injected current does not pass through said layer and does not damage it. The stored information, typically the orientation of the magnetization in the layer 53 is read both for a tunnel junction type structure and for a spin valve type structure by injecting a low value current (e.g. of the order of a few microamps (μA) to a few tens of μA for a tunnel junction) between the terminals C and B (or in equivalent manner between the terminals C and A), and by measuring the voltage between these terminals; or else by applying a constant voltage between the terminals B and C (or in equivalent manner between the terminals C and A), and measuring the current that flows between these terminals so as to measure in both cases the resistance between the terminals in question. The resistance has two different values depending on whether the direction of magnetization 56 is parallel or anti-parallel to that of the reference layer 58. The read current has a low value so that the tunnel barrier (when the layer 52 is dielectric) is not damaged.

As mentioned above, the applied magnetic field may conserve a constant direction, with reversal of the magnetization being obtained by the direction of current flow through the layers 54 and 53. This solution is preferred since it is easily integrated and does not imply additional consumption of electricity (when using permanent magnets).

Otherwise, the magnetization may naturally be reversed merely by reversing the direction of the applied magnetic field, while conserving the direction in which the current is injected.

Examples of memory architectures are described below with reference to FIGS. 3a to 3d, in which FIGS. 3b and 3d implement integrated permanent magnets.

FIGS. 3a to 3d show four implementations of a memory architecture in the first configuration, implementing the structure shown in FIGS. 2a and 2b.

The layer 70 of magnetic material is sandwiched between a conductive layer 72 and a stack 71 including the layers 52, 58, and 59 of FIGS. 2a and 2b in order to read the magnetization of the layer 70 by a tunnel junction (or a spin valve).

The read line 74 serves to power the point C of the memory points in a given line. A region of extra thickness 72' equivalent to the region 54' is also present.

A static magnetic field of direction 76 is applied parallel to the direction of the current flowing through the conductive layer 72.

The static field may be applied to the entire memory by one or more permanent magnets, or else to each of the studs formed by the individual stacks (three of which are shown), e.g. by means of permanent magnets 75a and 75b placed in register with each stud.

Two transistors 73a and 73b, e.g. of the metal-oxide-semiconductor (MOS) type may be implemented to apply the current in one direction and in the opposite direction through the conductive layer 72 (FIGS. 3a and 3b) or else a single transistor 73a is used, with the other end 78 being taken to a constant potential (FIGS. 3c and 3d).

The layer 72 is structured in the form of a current delivery track. It may include a layer of some other conductive material situated on the layer 72.

For a given memory point, write current may be injected in two different manners.

In a first manner, two transistors 73a and 73b are used that operate as switches, with the free terminals thereof being connected to ground for one of them and to a voltage $V_{dd}$ for the other, with the voltage $V_{dd}$ being selected so as to cause a current of the selected value to flow in one direction or the other depending on which one of the transistors 73a and 73b is connected to the voltage $V_{dd}$.

In the second manner, only one transistor 73a is used, with the other end of the stack 72 being connected at 78 to a constant voltage.

Symmetrical Operation:

The track connected to the transistor is connected to the potential $V_{dd}$ (or to ground) while the other track connected to the end of the track 72 at 78 is connected to ground (or to $V_{dd}$). This configuration enables a greater current to be generated than the following configuration.

Asymmetrical Operation:

The track connected to the end of the track 72 at 78 is connected to an intermediate potential, e.g. $V_{dd}/2$, while the track connected to the transistor 73a is taken respectively to the potential $V_{dd}$ or to ground depending on the desired current direction. This configuration enables less current to be generated. In the configuration of the invention, the current may be delivered to an area that is much smaller than the areas used in conventional techniques, and said current suffices to make the device operate. In this embodiment, operation consumes less electricity.

In the second configuration (FIGS. 4a to 4f), the direction 26 of the magnetization of the magnetic layer is situated in the plane thereof and is parallel to the direction of the injected current, and the e.g. constant magnetic field that is applied is perpendicular to the magnetization direction 26, and also to the direction of the spin-orbit magnetic field (effective magnetic field).

The applied magnetic field does not need to be exactly perpendicular to the direction of the magnetic field $H_{eff}$, but must have a non-zero component that is referred to below as the "useful" component of the applied magnetic field, that extends in the direction perpendicular to $H_{eff}$ (or to the spin-orbit field), and to the magnetization direction 26. The angle between the applied magnetic field and the useful component of said field may be up to 60°.

As for FIGS. 1a to 1f, three shapes are shown, namely in the form of a track (FIGS. 4a and 4b), and in the form of studs, the conductive track 24 housing a stud (FIGS. 4c and 4d) or else presenting a raised region 24' (FIGS. 4e and 4f) that is electrically conductive (generally made of metal) and that is not necessarily made of the same material as the track 24, in which case it is the extra thickness 24' that acts as the non-magnetic outer layer and it is its material that is operational in the stack for obtaining inversion asymmetry. The metal material of the layer 24 may then be any material.

For each of the shapes, 21 represents the direction of the injected current and 27 represents the direction of the useful component of the outer magnetic field that is applied (in compliance with the above remarks concerning direction). This direction is perpendicular to the plane of the layers 23 and 24 and thus to the magnetization direction 26 of the layer 23 and to the direction 21 of the injected current.

A thin layer 23 of a magnetic material is sandwiched between two layers of different non-magnetic materials, i.e. the layer 22 situated above and the layer 24 situated below, and the current is injected into the thin layer.

The typical stack comprises an electrically insulating substrate 25, e.g. a dielectric oxide (e.g. $SiO_X$, $AlO_X$, $MgO_X$) or a silicon nitride, e.g. $SiN_X$, on which the stack-forming structure is deposited. A fine layer of a magnetic material (or a combination of magnetic materials or of magnetic layers 23), e.g. a 3 nm thick layer of cobalt is sandwiched between two layers 22 and 24 of different non-magnetic materials, e.g. a dielectric layer 22 and a layer 24 of an electrically conductive material, generally a metal, e.g. platinum. The layers 22 and 24 may also be of two different metals. The magnetization of the magnetic layer 23 is contained in the plane being oriented along the axis of the track 26. The current is injected in the direction 21 parallel to the magnetization direction and an outer magnetic field is applied in a plane perpendicular to the magnetization with a useful component in the direction 27 perpendicular to the plane of the interfaces (or to the spin-orbit field).

A stud 28a or 28b (FIGS. 4c to 4f) containing the non-magnetic material 22 and the magnetic material 23 may be formed on the conductive track 24 in order to reverse only the magnetization contained in the stud. The stud 28b (FIGS. 4e and 4f) may contain a portion 24' of the thickness of the non-magnetic material 24. The stud 28a or 28b may have any shape: square, rectangular, disk-shaped, elliptical, or indeed any one of those shapes when deformed, the principle being that the magnetization is directed along the track. For this purpose, it is preferred to have an elliptical shape with its major axis parallel to the axis of the track.

As described above, the raised portion 24' may also be made of a conductive material that is different from the material of the layer 22 and of the conductive track 24.

The material of the substrate 25 may be selected from the same materials as are used in the first configuration.

Unlike the layer 13, the magnetic layer 23 needs to present planar magnetization with a thickness that is sufficiently fine to ensure that the effective magnetic field $H_{eff}$ due to the injected current and acting on the local magnetization is not negligible.

When the layers 22 and 24 are non-magnetic and conductive, it is desired to have a layer 23 with thickness such that its magnetic anisotropy lies in the plane. This thickness is typically greater than that of the layer 13 surrounded by the two layers 12 and 14 (FIGS. 1a to 1f) identical to the layers 22 and 24. When one of the two layers, typically the layer 22, is made of an electrically insulating material, typically an oxide such as $AlO_X$, $MgO_X$ $TiO_X$, $TaO_X$, . . . , it is possible simultaneously to increase the thickness of the magnetic layer or to vary the oxidation state of the oxide layer, e.g. while depositing said layer, or indeed after deposition by annealing in a vacuum.

Examples of such treatments may be found in the above-mentioned publications by B. Rodmacq et al. and by A. Manchon et al.

Thus, the thickness of this magnetic layer may in certain circumstances, and as a function of oxidation and/or annealing parameters, be identical to that used in the above-described first configuration, whereas the magnetization is perpendicular in that first configuration and planar in the presently-described configuration. This thickness for the second configuration typically does not exceed 5 nm, and is preferably less than or equal to 3 nm. All magnetic materials that present planar magnetization (Co, Fe, CoFe, NiFe, CoNi, . . . ) may be used. It is also possible to use non-metallic magnetic materials such as, for example magnetic semiconductors such as (Ga,Mn)As, depending on fabrication conditions.

As an illustrative example concerning (Ga,Mn)As, e.g. obtained by being grown on GaAs (100), compressive stress exists after the GaAs has been doped with Mn, thereby leading to planar anisotropy, whereas when it is caused to grow on GaInAs, the stress is different and magnetic anisotropy will result therefrom perpendicular to the planes. An example of this is to be found in "Anisotropic magnetization relaxation in ferromagnetic $Ga_{1-x}Mn_xAs$ thin films", Kh. Khazen, H. J. Von Bardeleben, M. Cubukcu, J. L. Cantin, V. Novak, K. Olejnik, M. Cukr, L. Thevenard, A. Lemaitre, Phys. Rev. B 78 195210 (2008); or indeed in "Ferromagnetic semiconductors: moving beyond (Ga,Mn)As", A. H. MacDonald, P. Schiffer, N. Samarth, Nature Materials 4, 195-202 (2005), doi/10.1038/nmat1325.

Everything stated about the layers 12 and 14 in the first configuration remains valid for the non-magnetic layers 22 and 24 except that the imposed restriction to the overall stack (layers 12, 13, and 14) having perpendicular magnetization is now replaced by the restriction that the stack has planar magnetization.

Omission of the Layer 24

Everything stated for the layer 14 can apply there.

Reversal of the Layer

Likewise, everything stated about the reversal of the magnetization in the first configuration may be reproduced identically here, considering the above-described magnetization direction and applied outer field direction. The same applies for the magnetic field values, for current density, and for how the magnetic field is applied.

With planar magnetization, the anisotropy field is of the order of $4\pi Ms$ where Ms is the saturated magnetization, i.e. about 1.5 T for Co. The value of the applied magnetic field may in practice lie in the range one-third to one-tenth the value of the effective anisotropy field and preferably lie in the range one-fourth to one-tenth said value. The values of the applied magnetic field may thus be greater than in the first configuration since the anisotropy field is generally greater.

FIGS. 5a and 5b show an example of a stack suitable for use in an MRAM magnetic memory cell or in a logic component, suitable both for writing and for reading.

A thin magnetic material 63 that presents magnetization in a direction 66 parallel to its plane is sandwiched between two layers 62 and 64 of different non-magnetic materials, the material 64 forming a conductor track on an insulating substrate, and possibly having a region 64' of extra thickness. The outer magnetic field is applied along the direction 67 perpendicular to the planes of the interfaces between the stacked layers. On this stack, there are superposed in succession a layer 68 of magnetic material, and a top electrode 69 presenting one or more layers of conductive materials that may optionally be magnetic in order to form, as in the first configuration, a stack as described with reference to FIGS. 4c to 4f. A, B, and C represent points for making electrical contact respectively with the ends of the track 64 (contacts A and B) and with the top electrode 69 (contact C).

FIG. 5b also shows an example of permanent magnetization magnets 60a and 60b integrated in the stud to generate the magnetic field in the direction 67. In order to enable contact to be made at C, the permanent magnet 60b is made of a conductive material.

FIGS. 6a to 6d show a memory architecture that implements the structure described with reference to FIGS. 5a and 5b, in four different embodiments.

In each of them, the magnetic layer 80 is sandwiched between a current feed layer 82, 82' and a stack 81 that has the layers 62, 68, and 69 of FIGS. 5a and 5b to define, as in the first configuration, a tunnel memory stack if the layer 62 is dielectric (or a spin valve type stack if the layer 62 is of non-magnetic metal), for reading the magnetization state of the layer 80.

In FIG. 6a, current is injected into the track 82 under the control of two transistors 83a and 83b.

Both for the tunnel junction type structure and for the spin valve type structure, the stored information, typically the orientation of the magnetization in the layer 80, is read by injecting a low value current (e.g. of the order of a few microamps or a few tens of microamps for tunnel junctions) between the terminals C (line 84) and B (or in equivalent manner between the terminals C and A), and by measuring the voltage between these terminals, or else by applying a constant voltage between the terminals C and B (or in equivalent manner between the terminals C and A) and measuring the current that flows between these terminals, always so as to measure the resistance between the terminals in question. The resistance has two different values depending on whether the magnetization direction 66 of the layer 80 is parallel or anti-parallel to the magnetization direction of the reference layer 68. The read current is of low value so that the tunnel barrier (when the layer 62 is dielectric) is not damaged.

Permanent magnets 85a and 85b may be integrated in the structure, respectively beneath the track 82 and above the stack 81, so as to apply the static field in the direction 86 perpendicular to the plane of the layer 80. The material constituting the permanent magnet 85a needs to be conductive so as to avoid disturbing reading.

FIGS. 6c and 6d differ from FIGS. 6a and 6b respectively by the fact that only one read transistor is used, the other end 88 (point B) of the current feed line 82 being connected to a constant potential.

The magnetization of the layer 80 is here reversed by a current traveling along the bottom electrode 82 in one direction or the other in the presence of the static magnetic field of direction 86, the outer layer of the stack 82, 80, 81 being structured in the form of a current feed track 82, possibly together with a conductive region of extra thickness 82'. As in the above-described examples, the portion 82' of extra thickness may be made of the same conductive material as the track 82 or of a different material.

For a given memory point, current may be injected for writing in two manners.

In a first manner, two transistors 83a and 83b are used that operate as switches, with the free terminals thereof being connected to ground for one of them and to a voltage $V_{dd}$ for the other, with the voltage $V_{dd}$ being selected to cause a current of the selected value to flow in one direction or the other depending on which one of the transistors 83a or 83b is connected to the voltage $V_{dd}$.

For the second manner, only one transistor 83a is used, with the other end of the track 82 being connected at 88 to a constant voltage.

Symmetrical Operation

The track connected to the transistor is raised to the potential $V_{dd}$ (or to ground potential) while the other track connected to the end of the track 82 at 88 is connected to ground (or to $V_{dd}$). This configuration enables more current to be generated than in the following configuration.

Asymmetrical Operation

The track connected to the end of the track 82 at 88 is connected to an intermediate potential, e.g. $V_{dd}/2$, while the track connected to the transistor 83a is connected respectively to the potential $V_{dd}$ or to ground depending on the direction desired for the current. This configuration enables less current to be generated. In the configuration of the invention, current may be delivered to an area that is much smaller than the areas used in conventional techniques, said current sufficing to enable the device to operate. In this embodiment, a saving is made in terms of energy consumption in operation.

The invention claimed is:

1. A writable magnetic element comprising a stack of layers presenting a write magnetic layer, wherein the stack has a central layer of at least one magnetic material presenting a direction of magnetization that is parallel or perpendicular to the plane of the central layer, said central layer being sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, wherein it includes a device for causing current to flow through the second outer layer and the central layer in a current flow direction parallel to the plane of the central layer, and a device for applying a magnetic field having a component along a magnetic field direction that is either parallel or perpendicular to the plane of the central layer and the current flow direction, and wherein the magnetization direction and the magnetic field direction are mutually perpendicular.

2. A magnetic element according to claim 1, wherein the magnetic field is either parallel or perpendicular to the plane of the central layer and the current flow direction.

3. A magnetic element according to claim 1, wherein the magnetic field direction is parallel to the current flow direction, and wherein the magnetization is perpendicular to the plane of the magnetic central layer.

4. A magnetic element according to claim 3, wherein the central layer has a thickness lying in the range selected from the group consisting of 0.1 nm to 5 nm and less than or equal to 2 nm.

5. A magnetic element according to claim 1, wherein the magnetization direction is parallel to the current flow direction and in that the magnetic field direction is perpendicular to the plane of the magnetic central layer.

6. A magnetic element according to claim 5, wherein the central layer has a thickness lying in the range selected from the group consisting of 0.1 nm to 5 nm and less than or equal to 3 nm.

7. A magnetic element according to claim 3, wherein the central layer comprises an alloy selected from the group consisting of FePt, FePd, CoPt, GdCo, and TdFeCo.

8. A magnetic element according to claim 3, wherein the central layer comprises a metal or an alloy presenting in the stack perpendicular magnetic anisotropy induced by the interfaces, said metal or alloy being selected from the group consisting of Co, Fe, CoFe, Ni, and CoNi.

9. A magnetic element according to claim 5, wherein the central layer comprises a metal or an alloy presenting planar magnetic anisotropy in the stack, in particular Co, Fe, CoFe, Ni, NiFe, CoNi.

10. A magnetic element according to claim 1, wherein at least one outer layer is conductive and is made of a non-magnetic selected from the group consisting of Pt, W, Ir, Ru, Pd, Cu, Au, and Bi, and alloys thereof.

11. A magnetic element according to claim 10, wherein the thickness of said conductive outer layer is selected from the group consisting of less than 10 nm and less than or equal to 5 nm.

12. A magnetic element according to claim 1, wherein the first outer layer is made of a dielectric oxide selected from the group consisting of $SiO_X$, $AlO_X$, $MgO_X$, $TiO_X$, $TaO_X$, and $HfO_X$, or of a dielectric nitride selected from the group consisting of $SiN_X$ and $BN_X$.

13. A magnetic element according to claim 12, wherein the thickness of a said outer layer lies in the range selected from the group consisting of 0.5 nm to 200 nm, 0.5 nm to 100 nm, and less than 3 nm.

14. A magnetic element according to claim 1, wherein both outer layers are conductive and are selected from two different ones of said non-magnetic materials or alloys.

15. A magnetic element according to claim 1, wherein said current presents current density lying in the range selected from the group consisting of $10^4$ A/cm$^2$ to $10^9$ A/cm$^2$ and $10^5$ A/cm$^2$ to $10^8$ A/cm$^2$.

16. A magnetic element according to claim 1, wherein the applied magnetic field presents a value lying in the range selected from the group consisting of 0.002 T to 1 T and 0.005 T to 0.8 T.

17. A magnetic element according to claim 1, wherein the first outer layer is covered in a read layer of magnetic material and in a read electrode.

18. A magnetic element according to claim 17, wherein the first outer layer is made of non-magnetic metal and in that it co-operates with the read layer, the read electrode, and the central layer to form a spin valve.

19. A magnetic element according to claim 17, wherein the first outer layer is dielectric and in that it co-operates with the read layer, the read electrode, and the central layer to form a magnetic tunnel junction.

20. A magnetic element according to claim 17, wherein thickness of the first outer layer is less than 3 nm.

21. A magnetic element according to claim 1, wherein the first outer layer and the central layer form a stud, while the second outer layer forms a track.

22. A magnetic element according to claim 21, wherein the second outer layer includes a region of extra thickness forming part of the stud.

23. A writable magnetic device, comprising a plurality of studs according to claim 21, with the second outer layer thereof including a said track that is common to the studs.

24. A writable magnetic device, wherein the first outer layer, the central layer, and the region of extra thickness of the second outer layer form a stud according to claim 22, and wherein the device includes a plurality of said studs, together with an electrically conductive track beside the second outer layer of said stud to inject said current through the second outer layer and the central layer of each of said studs, the second outer layer being made of an electrically conductive material different from the material of the electrically conductive track.

* * * * *

UNITED STATES PATENT AND TRADEMARK OFFICE
CERTIFICATE OF CORRECTION

PATENT NO. : 8,416,618 B2
APPLICATION NO. : 12/899091
DATED : April 9, 2013
INVENTOR(S) : Gaudin et al.

Page 1 of 1

It is certified that error appears in the above-identified patent and that said Letters Patent is hereby corrected as shown below:

In the Specification

Column 5,
Line 14, "Joan" should read --Ioan--;
Line 46, "MgO)$_x$" should read --MgO$_x$)--.

Column 6,
Line 56, "MgO$_x$" should read --MgO$_x$,--.

Column 13,
Line 26, "Lemaitre" should read --Lemaître--.

Signed and Sealed this
Thirteenth Day of August, 2013

Teresa Stanek Rea
*Acting Director of the United States Patent and Trademark Office*